GATING SYSTEM FOR REDUCING THE EFFECTS OF NEGATIVE FEEDBACK NOISE IN MULTIPHASE GATING DEVICES

Filed March 10, 1967

INVENTOR.
ROBERT K. BOOHER
BY Robert G. Rogers
ATTORNEY

United States Patent Office 3,518,451

Patented June 30, 1970

3,518,451

GATING SYSTEM FOR REDUCING THE EFFECTS OF NEGATIVE FEEDBACK NOISE IN MULTIPHASE GATING DEVICES

Robert K. Booher, Downey, Calif., assignor to North American Rockwell Corporation, a corporation of Delaware Filed Mar. 10, 1967, Ser. No. 622,867
Int. Cl. G11c *19/00*
U.S. Cl. 307—221 4 Claims

ABSTRACT OF THE DISCLOSURE

A multiphase gating system which reduces the effects of negative noise which is normally present at the outputs of the stages comprising prior art multiphase gating systems by isolating the outputs of the stages and by charging the remaining inherent capacitance associated with the stages which use the outputs of the other stages either before or during the time interval that inputs to the other stages are being evaluated. In the present gating system, the output, including the inherent capacitance associated with the output, is isolated from the remainder of the stage while the inherent capacitance associated with the MOS devices comprising a stage is charged.

BACKGROUND OF THE INVENTION

Field of the invention

This invention relates to a gating system for reducing the effects of negative noise at the outputs of multiphase gating devices, and more particularly, to such a system which pre-charges certain inherent capacitance of a particular stage when the inputs to the stage are either connected to ground or are at a negative level, thus eliminating the effects of negative noise fed back from the particular stage when it is being pre-charged to the stages providing the inputs.

Description of prior art

During development of compact MOS-IC gating systems, negative voltage levels, described as noise herein, were fed back to outputs of previous stages through inter-electrode capacitance associated with the inputs to a particular stage. The problem became more pronounced as the threshold voltages for MOS were made much lower. In other words, if a false output was set to a sufficient negative voltage level by a noise voltage, that level could turn on other MOS devices of other stages using that output as one of its inputs. When the incorrect inputs to the stages were evaluated, the inputs would appear to be true although they may have been previously set false.

More sophisticated conductor and device layouts have been attempted in order to reduce the inter-electrode capacitance and therefore the amount of feedback. However, the noise has not appreciably reduced by such change. Although noise might have been reduced at one stage, it increased at another.

In certain instances, capacitors were added to the relatively fast circuits without affecting the response time of the overall integrated circuit. For the fast circuits, the capacitor reduced the noise levels but didn't reduce its speed below that of the other circuits. In other cases, however, the added capacitance reduced the speed of the circuit below a required speed. Larger MOS devices were substituted for smaller devices to increase the speed of the stage, but the larger devices added more noise to the outputs of the stages which provided inputs to the larger devices.

Applicant is unaware of any art which has solved the problem, although in order to produce reliable MOS switching systems, the noise level or its effects must be reduced. Desirably, a system is required for reducing the noise without materially changing the layouts of systems, sizes of MOS devices, adding capacitors, etc.

SUMMARY OF THE INVENTION

Briefly, the invention comprises a plurality of MOS switching devices forming a multiphase switching system including means for selectively gating each stage of the system and means for isolating the outputs of each stage during certain intervals. The gating sequence comprises means for charging the inherent capacitance of each stage unconditionally true (negative voltage level) during the same time interval as the inputs to that stage (outputs of previous stages) are either connected to ground or are at a negative level, and the output of that stage is isolated. As a result, negative feedback voltage from the stage which is being precharged true to the stages providing inputs to those stages, is connected to ground or it increases an existing negative voltage on the inputs. The term "pre-charge" is used to describe the charging of inherent capacitances associated with MOS devices comprising a stage before the output is "charged" or set unconditionally true by charging the inherent capacitance associated with the output. In effect, the substrate in which the MOS devices are formed is charged at a time interval before the output capacitance is charged so that when the output capacitance is charged, a zero change of voltage occurs across inter-electrode capacitances associated with the other portions of the MOS devices and no feedback voltage occurs.

The feedback path comprises inter-electrode capacitance associated with the input devices of a particular stage. Since each stage is comprised of a plurality of MOS devices, and since the output of each stage is isolated by a single device, and since the internal portion of the stage is pre-charged before the output is charged, the output can be charged at a relatively faster rate. In other words, in a particular embodiment a first MOS switching device is connected between the output (effective capacitance) and other MOS devices of a stage. During one interval of a gating cycle when the output is isolated by the first switching device, the inherent capacitance of the remainder of the stage structure, which is comprised of the source and drain to substrate capacitance and the source and drain to gate capacitance, is set to a negative level. When the output of the stage is subsequently set true, no added time is required for changing the inherent capacitance associated with the gate structure.

Therefore, it is an object of this invention to provide a gating system for reducing the effects of negative noise at the inputs to multiphase gating devices.

Still another object of this invention is to provide a gating system for eliminating the effects of negative noise fed back through interelectrode capacitances between stages.

Still another object of this invention is to provide a gating system for reducing the effects of negative noise in the system without the necessity for changing conductor or device layout.

Still another object of this invention is to provide a gating system for reducing effects of negative noise in the system without changing the size of MOS devices and without the necessity for adding capacitors.

A still further object of this invention is to provide a gating system for eliminating the effects of negative noise on the outputs of multiphase devices comprising a multiphase gating system and for improving the switching time of output voltage levels.

A still further object of this invention is to pre-charge the inherent capacitance of MOS devices of certain stages of a multiphase gating system while the output is isolated for reducing the effects of negative feedback noise to other stages.

A still further object of this invention is to provide an improved multiphase gating system comprising a plurality of similar stages by reducing the negative feedback noise between stages.

DESCRIPTION OF THE PREFERRED EMBODIMENTS

Figure 1:
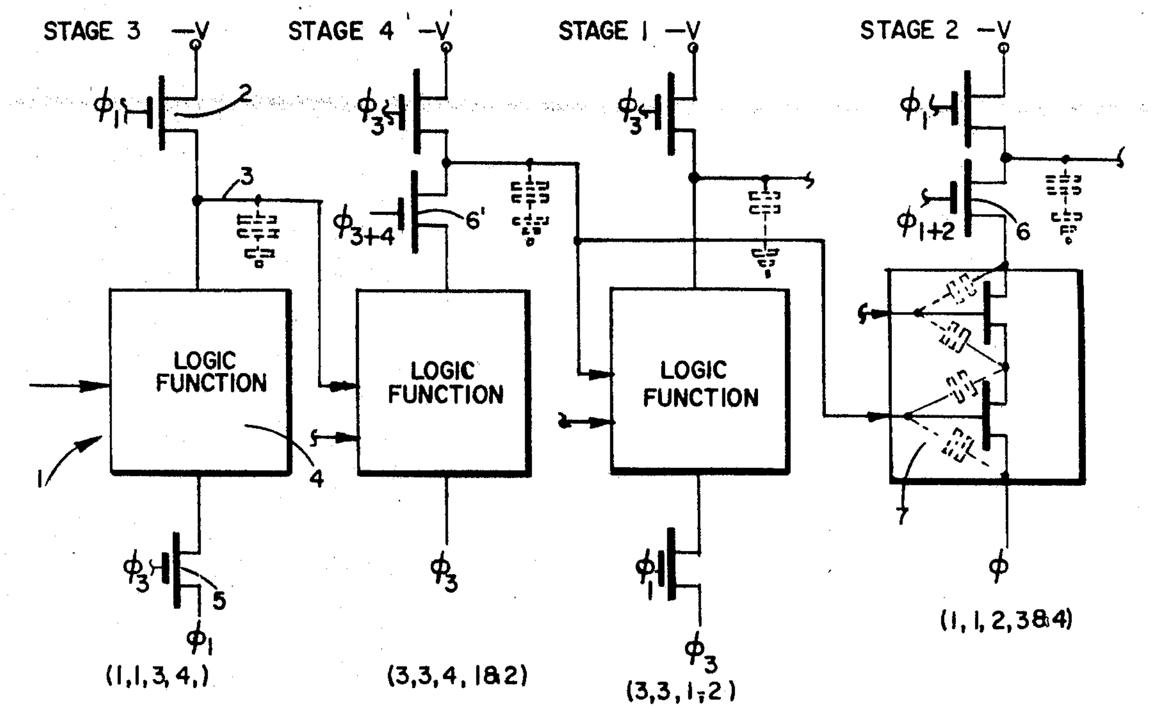
FIG. 1 PRIOR ART
FIG. 1 represents a system having negative noise feedback which interferes with system operation.

Because of the difficulties associated with a general description of the negative noise problem, a more detailed description is given in connection with FIG. 1 wherein is shown conventional multiphase gating system 1 having negative feedback noise which may interfere with the operation of the system. Stage 3 is comprised of switching device 2, connected between output 3 and voltage source —V. Logic function 4 is connected between the output and switching device 5. Switching device 5 is connected between altering voltage source $\phi_1$ and the logic function. The switching devices are mechanized by means of MOS devices which are turned on when the signals designated as $\phi_1$ and $\phi_3$ are true. The signal $\phi_1$ through $\phi_4$ becomes true in sequence beginning with $\phi_1$.

The logic function may comprise one of a plurality of such devices having their gate electrodes connected to receive signals from previous stages. Depending on the state of the input signals to the logic function, the output may be set false, or it may remain true as a result of having been unconditionally set true at a previous time interval. In other words, when $\phi_1$ is true, the output is unconditionally set true because switching device 2 is turned on and switching device 5 is turned off. During the time that $\phi_3$ is true, if the inputs are true, the output is set false because during that time $\phi_1$ is false. The output can be used as an input to a subsequent stage during $\phi_4$ time because the output is not changing during $\phi_4$ time. The output may be described as floating during $\phi_4$ time because both $\phi_3$ and $\phi_1$ are false. The other stages are similarly mechanized except for stages 4 and 2 which have isolation devices 6 and 6' connected between their outputs and their logic functions. A legend which describes the operation of each stage with reference to the phase signal is shown below each stage. The description shown in connection with FIG. 2 is applicable to the FIG. 1 numbers.

Negative noise is fed back, for example, from stage 2 into stage 4 when the output of stage 2 is being unconditiaonally set true or negative. Various inter-electrodes and other capacitances provide feedback paths to the stage although for purposes of this description, the capacitance has been lumped together and illustrated as capacitance 7.

In order to describe how feedback affects system operation, assume that the output of stage 4 is set false or zero and that the output comprises an input to the logic functions of stage 1 and of stage 2. Whenever $\phi_1$ becomes true, negative noise is "fed back" through the interelectrode capacitance of the device comprising the logic function of stage 2, to the output of stage 4 which also comprises an input to stage 1. As a result, the input to stage 1 which is evaluated at $\phi_1$ time, would appear to be true, assuming that enough negative noise is coupled into the stage 4 output, although the stage 4 output has previously been set false and is assumed to remain false.

Figure 2:
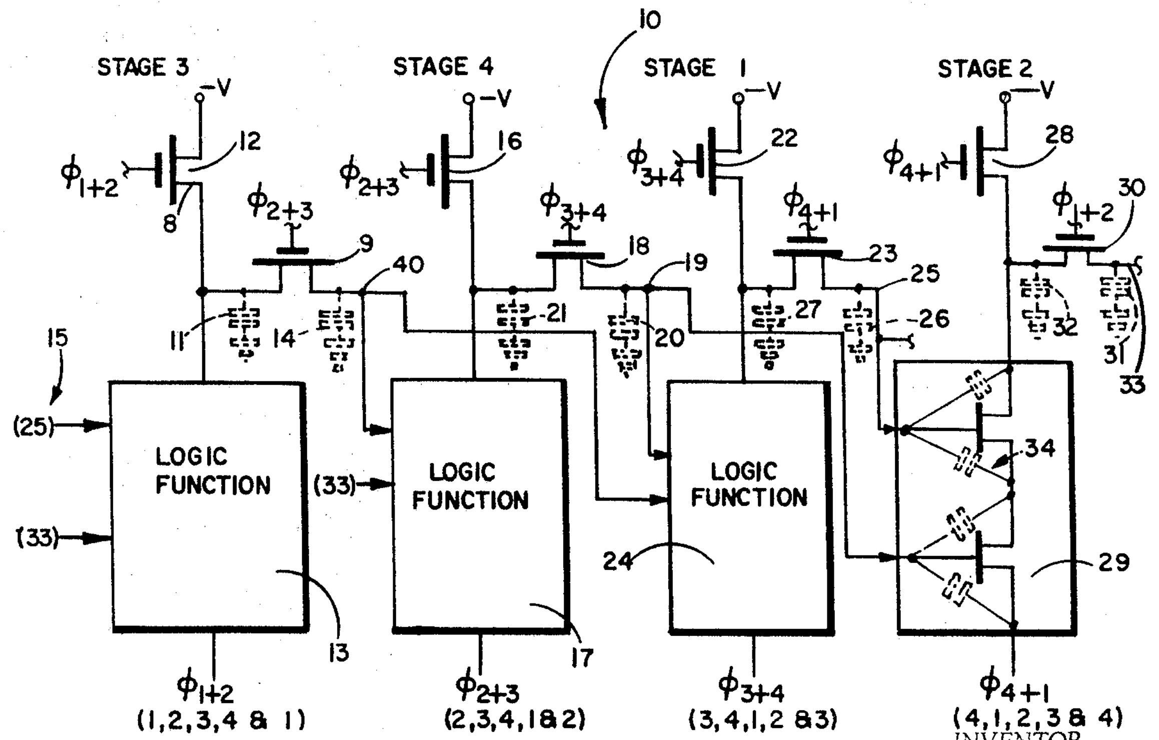
FIG. 2 represents one embodiment of a system having a gating sequence for eliminating effects of negative feedback noise.
Figure 2:
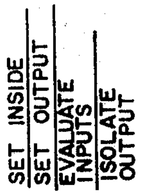

FIG. 2 shows one embodiment of a system which eliminates the effects of the negative feedback noise by changing the location of certain switching devices and by changing the gating signals applied to the individual stages. The embodiment comprises multiphase gating system 10, havin stages 1, 2, 3 and 4 gated by phase signals which are defined by phase signals $\phi_1$ through $\phi_4$.

Stage 3 comprises switching device 12 connected between voltage source —V and logic function 13. Switching device 9 is connected between electrode 8 of device 12 and the output. Inherent capacitance 14 is shown as being connected to the output. Although an actual capacitor could be connected to each output, the inherent capacitance associated with the output conductor is adequate for holding a charge over the required interval. Logic function 13 is connected between device 12 and an alternating voltage source designated as $\phi_{1+2}$. Inherent capacitance 11 is shown connected to electrode 8 of device 12. Alternating voltage source $\phi_{1+2}$ is connected to the gate electrode of device 12. Alternating voltage $\phi_{2+3}$ is connected to the gate electrode of device 9. The plus (+) sign between the subnumber delineating one phase signal from another signifies a logical "or."

The function of the stage can best be described in connection with the legend set forth below the stage. The first digit represents the phase time during which the inherent capacitance of the stage (excluding the output capacitance) is pre-charged. The second digit represents the phase time during which the output capacitance of the stage is charged. The third digit represents the phase time during which inputs to the logical function of the stage are evaluated. The last digits represent the phase times during which the output of the stage is stable.

For example, in stage 3 when $\phi_{1+2}$ is true, effective capacitor 11 shown connected to electrode 8 of switching device 12 and logic function 13, is set to a —V level. Although an effective capacitance is shown for stage 3 and other stages of the system it should be understood that the capacitance represents the inherent capacitance of the various portions of the device (excluding the output) and is lumped into one capacitor for simplicity of illustration. During the true interval of $\phi_2$, effective capacitance 14 comprising the output is unconditionally set to the level of —V. During the true interval of $\phi_3$, the state of various inputs 15 to logic function 13 are evaluated. In other words, if the inputs are all true, during $\phi_3$ time, the output is set false because $\phi_{1+2}$ is false during that interval. During the true intervals of $\phi_4$ and $\phi_1$, the output is isolated from other portions of the stage by switching device 9. During the isolation period, the output can be used as inputs to other stages. The output must be stable during the time that it is being used by other stages so that a true indication of the state of the output is given.

Stage 4 includes switching device 16 connected between —V and logic function 17. Switching device 18 is connected between output 19 and a common point between switching device 16 and logic function 17. Stage 4 also includes effective capacitance 20 at the output and effective capacitance 21 at the junction of switching device 18 and logic function 17. The functional sequence for the stage is set forth as a legend beneath the stage.

Stage 1 comprises switching device 22 connected between —V and logic function 24. Switching device 23 is connected between output 25 and the junction of switching device 22 and logic function 24. Stage 1 includes effective capacitance 26 connected at the output and effective capacitance 27 connected at the junction of the switching devices and the logic function. The functional sequence for the stage is set forth beneath the stage as a legend.

Stage 2 includes switching device 28 which is connected between logic function 29 and voltage source —V. Switching device 30 is connected between output 33 and a common point between switching device 28 and logic function 29. Effective capacitor 31 is connected to the output. Effective capacitor 32 is connected at the junction of the switching devices 28, 30 and the logic function 29.

The various logic functions may be comprised of one or more devices such as shown in connection with logic function 29. Logic function 29 illustrates two switching devices in series as comprising the function although in other applications more switching devices may be connected in series or parallel to mechanize the function. Logic function 29 shows inter-electrode capacitances 33 for each switching device mechanizing the logic function. The devices mechanizing the other logic functions also include inter-electrode capacitances although for convenience, the capacitance is shown only in connection with logic function 29.

Each of the logic functions is connected to a gating signal as shown in FIG. 2. For example, the gating signals to stage 3 are $\phi_{1+2}$, and to stage 4, $\phi_{2+3}$; to stage 2, $\phi_{4+1}$; and to stage 1, $\phi_{3+4}$.

Outputs from certain of the stages of the system comprise inputs to other stages of the system. For example, the output from stage 3 comprises inputs to the logic function of stage 4 and the logic function of stage 1. The outputs from stage 4 comprise inputs to the logic function of stage 1 and stage 2. The outputs from stage 2 comprise inputs to stages 3 and 4. Although two inputs are shown for each logic function, in other embodiments a logic function may have a single input or a plurality of inputs.

The various switching devices described in connection with the system may be mechanized by MOS transistors having first and second electrodes and having a gate, or control electrode disposed over a semiconductor substrate. Depending on the type of MOS devices, when a negative voltage appears at the gate electrode of the device, the device is turned on if the control voltage exceeds the voltage at the source electrode by an amount called the threshold voltage of the device. In other words, the control electrode must provide a voltage which is in excess of the threshold voltage for the device. The threshold voltage may be defined as the voltage at which the MOS device turns on.

For the particular embodiment shown and described herein, it is assumed that the MOS devices are formed from p type materials, and for that reason negative voltages are illustrated. However, in other embodiments, the MOS devices may be formed from n type materials and as a result, positive voltages would be used. A more detailed description of how p type or n type MOS devices may be formed can be found in patent application No. 523,767 for a Multiple Phase Gating System filed on Jan. 28, 1966 by R. K. Booher.

In operation, assuming that $\phi_4$ is true, capacitor 32 of stage 2 is unconditionally set true. Simultaneously, capacitor 26 of stage 1 is also unconditionally set true. The inputs to stage 4 are evaluated during $\phi_4$ time and the outputs from stages 2 and 3 are isolated. The output from stage 4 comprises inputs to stages 1 and 2. A portion of the negative voltage representing the true level of $\phi_4$ is fed through inter-electrode capacitances 34 to the output of stage 1. However, since the output is being unconditionally set true during $\phi_4$, the only effect is that the output voltage would be slightly increased. The only effect would be to increase the speed of devices connected to that output. In addition, the negative voltage is also fed back to the output of stage 4. During $\phi_4$, the inputs to stage 4 are being evaluated. If, as a result of the evaluation the output remains true, the negative voltage fed back from stage 2 cannot affect the stage of the stage 4 output. Assuming, however, that the inputs are true, the output is connected to ground and as a result, the electrode feedback voltages are also ground so that the output voltage is not increased. Hence the state represented by the output voltage on capacitor 20 of stage 4 will not be affected by the negative noise feedback voltage originating from stages where the output is used as inputs. If the changes described had not been made, however, the false level may have been changed to a negative or true level by the effects of the feedback voltage.

As described, during $\phi_4$ time, capacitor 32 was unconditionally set true. During the next interval, $\phi_1$, when output capacitor is being set, it can be set at a relatively faster rate because there is no requirement for charging capacitor 32. As a result, the speed of that stage and each of the stages is improved. In other cases, a delay would be incurred because all the capacitances of the device would have to be charged during one phase time. In this case, the charging time is divided into two separate intervals. In effect, the pre-charging of the inherent capacitance of the devices of a stage (excluding the output capacitance) was advanced by one phase time with respect to the pre-charging which occurred with prior art systems. In prior art systems, however, all the inherent capacitance of a stage (including output capacitance) was charged at one time. Because of the configuration of the stages comprising previous systems and because of the clocking sequence, pre-charging as described herein, is not possible.

Although the operation of only one stage was described in detail, since each stage is similar with each other stage, the operation described for stage 2 is applicable for the other stages, except that the phase signals to each stage are different. As a result of each stage being similar, the output of any stage can be used as inputs to two succeeding stages without additional logic or clock signals such as would be the case in prior art systems.

Although the invention has been described and illustrated in detail, it is to be understood that the same is by way of illustration and example only, and is not to be taken by way of limitation; the spirit and scope of this invention being limited only by the terms of the appended claims.

I claim:

1. A multiphase gating system having an output including inherent capacitance, said gating system comprising, a two terminal logical network comprising one or more field effect transistors having one or more control electrodes, the signals on said control electrodes determining the existence of an electrical path from one terminal to the other, means including a field effect transistor for applying substantially the same voltage level to both terminals of said logical network during a first and a second phase recurring clock signal, said field effect transistor being operable only during said first and second phase recurring clock signals, means for applying a different voltage level to one terminal of said logical network during a third phase recurring clock signal, and an isolation field effect transistor means for connecting said other terminal to the output during said second and said third phase recurring clock signals.

2. A multiphase gating system including means for reducing the effects of feedback noise voltage caused by inherent capacitance associated with each stage of the system comprising, a plurality of stages, each stage having at least one input and an output connected to an input of at least one other stage, each input having inherent capacitance between the input and the stage, each stage further including a two terminal logical network having first and second terminals comprising one or more field effect transistors having one or more control electrodes each comprising an input to the stage, the signals on the control electrodes determining the existence of an electrical path from one terminal to the other, and means including a field effect transistor means for applying substantially the same voltage level to said first and second terminals of said logical network during a first and a second phase recurring clock signal, said field effect transistor means being operable only during said first and second phase recurring clock signals, said inherent capacitance between the input and the stage being charged during the first phase recurring clock signal for reducing the effects of said feedback noise voltage during said second phase recurring clock signal, means for applying a different voltage level to the second terminal of said logical network during a third phase recurring clock signal, and isolation field effect transistor means for connecting said first terminal to the output during said second and third phase recurring clock signals, said clock signals for each stage being synchronized so that said first terminal is connected to the output subsequent to the phase recurring clock signal of at least one other stage during which the inherent capacitance of the input to at least said one other stage is charged, said output being connected to the input of at least said one other stage.

3. The combination as recited in claim 2, wherein each stage has more than one input with each input being connected to a different output of another of said plurality of stages, said outputs being isolated from their associated stages during the phase recurring clock signal that the inherent capacitance associated with the inputs to a stage is being charged.

4. A multiple phase logical gating circuit for eliminating the effects of feedback noise voltage caused by the inherent capacitance associated with the circuit, said circuit comprising, a logical network having first and second terminals comprising one or more field effect transistors having one or more control electrodes, the signals on the control electrodes determining the existence of an electrical path from one terminal to the other, said logical network having inherent capacitance between the control electrodes of said field effect transistors and the other electrodes of said field effect transistors, means including field effect transistor means for applying substantially the same voltage level to said first and second terminals of said logical network during a first and a second phase recurring clock signal, said inherent capacitance of the logical network between the control electrodes and the other electrodes of said field effect transistors being charged during said first phase recurring clock signal, means for changing the voltage level on said first terminal of said logical network during a third phase recurring clock signal, and means for connecting said second terminal to an output during said second and third phase recurring clock signals.

References Cited

UNITED STATES PATENTS

| | | | |
|---|---|---|---|
| 3,395,292 | 7/1968 | Bogert | 307—279 |
| 3,322,974 | 5/1967 | Ahrons | 307—279 |
| 3,233,123 | 2/1966 | Heiman | 307—205 |

DONALD D. FORRER, Primary Examiner

D. M. CARTER, Assistant Examiner

U.S. Cl. X.R.

307—205, 208, 251